United States Patent [19]

Springfield et al.

[11] Patent Number: 4,897,556

[45] Date of Patent: Jan. 30, 1990

[54] HIGH VOLTAGE PULSE CONDITIONING

[75] Inventors: Ray M. Springfield, Sante Fe; Robert M. Wheat, Jr., Los Alamos, both of N. Mex.

[73] Assignee: The United States of America as represented by the United States Department of Energy, Washington, D.C.

[21] Appl. No.: 313,201

[22] Filed: Feb. 21, 1989

[51] Int. Cl.[4] .......... H03K 3/537

[52] U.S. Cl. .......... 307/106; 307/108; 315/5.34; 315/5.41; 328/233

[58] Field of Search .......... 307/105-109, 307/127, 147, 110; 328/67, 233, 237; 250/396 R; 315/3, 4, 3.5, 5.41, 5.42, 5.43, 5.34, 5.35, 17; 200/144 B, 151; 313/359.1, 441, 446, 452, 456, 296, 297

[56] References Cited

U.S. PATENT DOCUMENTS

| | | | |
|---|---|---|---|
| 3,908,160 | 9/1975 | Thompson, Jr. et al. | 328/233 X |
| 4,011,463 | 3/1977 | Fasching | 307/110 |
| 4,016,499 | 4/1977 | Budker et al. | 328/233 |
| 4,477,746 | 10/1984 | Piltch | 307/107 X |
| 4,547,679 | 10/1985 | Hansen et al. | 307/106 X |
| 4,754,196 | 6/1988 | Burke et al. | 315/5.34 X |
| 4,763,079 | 8/1988 | Neil | 315/5.41 X |

*Primary Examiner*—William M. Shoop, Jr.
*Assistant Examiner*—Paul Ip
*Attorney, Agent, or Firm*—Milton D. Wyrick; Paul D. Gaetjens; William R. Moser

[57] ABSTRACT

Apparatus for conditioning high voltage pulses from particle accelerators in order to shorten the rise times of the pulses. Flashover switches in the cathode stalk of the transmission line hold off conduction for a determinable period of time, reflecting the early portion of the pulses. Diodes upstream of the switches divert energy into the magnetic and electrostatic storage of the capacitance and inductance inherent to the transmission line until the switches close.

8 Claims, 2 Drawing Sheets

HIGH VOLTAGE PULSE CONDITIONING

BACKGROUND OF THE INVENTION

This invention relates to the field of high voltage pulse generation and, more specifically, to the conditioning of high voltage pulses in a vacuum environment. The invention is a result of a contract with the Department of Energy (Contract No. W-7405-ENG-36).

High voltage electrical pulses, or transverse electromagnetic mode (TEM) waves, in a vacuum environment are widely used in physics research, particularly in the area of plasma physics research. These pulses are generated by particle accelerators, and typically have a pulse rise time of approximately 30 nanoseconds. Short rise times are critical, as these pulses are used to conduct experiments with delicate configurations because they can achieve desired experimental conditions very rapidly. Otherwise, these experiments may be disrupted and the equipment may even be damaged by long, slowly rising pulses. For many experiments, the 30 nanosecond rise time of the pulses from the accelerator are unsatisfactory.

Extremely short rise time pulses make certain experiments possible which would otherwise not be feasible. They also allow better reproducibility of starting conditions. One application where such features are necessary is with very fast rising Bremsstrahlung radiation experiments.

Other circuits require a high rate of amps/sec (dI/dt) in order to function properly. Fast pulse rise times also allow the more fragile, easily disrupted experiments, such as those having smaller geometries, or those having carefully controlled plasma conditions, to be performed. Additionally, fast rise time pulses allow higher microwave production from the accelerator because of improved electron coherence. And particle and cell modeling using computers can better model experiments with shorter, less expensive run times.

However, one of the greater advantages of fast rising pulses is the ability to tailor the Fourier transform of the pulse. This allows the experimenter to thoroughly investigate the radio frequency resonances of a structure by including numerous frequency components in the pulse.

It is an object of the present invention to provide high voltage pulse conditioning apparatus which will shorten the rise time of a pulse from a pulse generator.

It is a further object of the present invention to provide pulse conditioning apparatus which can be easily incorporated into the cathode stalk of a particle accelerator.

It is a feature of the present invention that electron beam pulses can be produced in a vacuum environment having rise times of approximately 0.5 nanosecond.

SUMMARY OF THE INVENTION

To achieve the foregoing and other objects, and in accordance with the purposes of the present invention, as embodied and broadly described herein, apparatus for conditioning high voltage pulses may comprise a particle accelerator capable of producing in a vacuum a pulse having a very fast rise time between a cathode and an anode comprising means for generating a high-voltage pulse; a transmission line connected to the generating means for conducting the pulses, the transmission line having inherent inductance and capacitance capable of storing energy magnetically and electrostatically; a plurality of diode means located radially about the transmission line between the cathode and the anode for diverting energy from the transmission line into the inductance of the transmission line; one or more series connected flashover switch means connected between the transmission line and the cathode for delaying conductance of the pulse for a determinable period of time before closure of the one or more flashover switch means;

In a further aspect of the current invention, and in accordance with its objects and purposes a method of producing in a vacuum a pulse having a very fast rise time between a cathode and an anode of a particle accelerator may comprise the steps of generating a high voltage pulse; conducting the high voltage pulse along a transmission line having inherent inductance and capacitance; diverting energy from the transmission line into the inductance through a plurality of diodes located radially about the transmission line between said cathode and said anode; storing said energy magnetically and electrostatically in said capacitance and inductance of said transmission line; delaying conductance of the high voltage pulse for a determinable period of time before closure of one or more flashover switches; transmitting the high voltage pulse and the energy from the inductance and capacitance of the transmission line from the one or more flashover switches to the cathode and from the cathode to the anode.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

DETAILED DESCRIPTION

Figure 1:
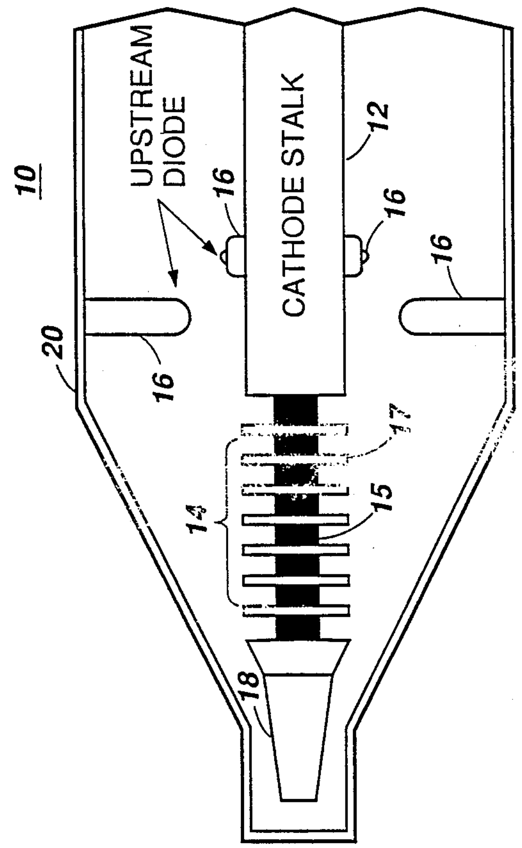
FIG. 1 is a cutaway view of the cathode stalk region of a particle accelerator showing insertion of the flashover switch and diodes according to the present invention.

The present invention conditions pulses produced by a particle accelerator in order to greatly improve the rise time of the pulses. This is primarily accomplished by inserting one or more flashover switches into the cathode stalk of the accelerator and installing a series of diodes upstream of the switches. Referring now to FIG. 1, there can be seen transmission line 10 of a conventional particle accelerator (not shown) having cathode stalk 12 cathode end 18 and anode 20. In the case of a traveling TEM wave, anode 20. cathode stalk 12 and cathode end 18 comprise transmission line 10. Flashover switch 14 is inserted between cathode stalk 12 and cathode end 18. Upstream from flashover switch 14 a series of diodes 16 are radially positioned around cathode stalk 12 between cathode stalk 12 and anode 20.

As a transverse electromagnetic mode (TEM) pulse generated by the particle accelerator (not shown) propagates along cathode stalk 12 a portion of its energy is diverted by diodes 16 into the lumped inductance of transmission line 10 and stored in the inherent inductance prior to the time of closure of flashover switch 14. When the TEM pulse encounters flashover switch 14 wave reflection occurs, resulting in a voltage increase which stores energy electrostatically upstream of flashover switch 14.

At the point at which the voltage across flashover switch 14 reaches a sufficient magnitude, flashover switch 14 closes, and the energy stored in the inherent capacitance and inductance of cathode stalk 12 is dumped across flashover switch 14 to sharpen the rise time of the pulse. The plasma propagates across flashover switch 14 at a velocity of approximately 0.1 c. At the time of closure, current flow through diodes 16 is cut off due to magnetic insulation. This magnetic insulation is caused by the now high current flow along cathode stalk 12. The magnetic field diverts the electrons into or parallel with cathode stalk 12.

The use of diodes 16 allows the rise time of the pulse to be varied from extremely sharp without diodes 16 providing a low impedance path, to longer rise times when diodes 16 are used. Diodes 16 are of conventional design and are fabricated for the particular application. They may be installed approximately 30 cm from flashover switch 14. However, the location may be either closer to or farther from switch 14 to achieve a particular pulse shape.

In one embodiment, flashover switch 14 consists of a series of eight (8) insulator-metal gradient rings stages, each comprised of a metal ring 17 normally made of stainless steel or aluminum, and insulator ring 16 which is a dielectric material such as nylon, PVC, or LEXAN®. In their conventional application, flashover switches are intended to avoid flashover. In the present application, flashover switches are used as switches which prevent conductance until a specific voltage across flashover switch 14 has been achieved. By delaying conductance, the leading edge of the pulse is reflected by flashover switch 14 thereby further sharpening the rise time of the conducted pulse. To achieve the required rise times, flashover switch 14 must multichannel during its conductance period.

Each stage of flashover switch 14 involves a metal ring 17. approximately 0.25 inch thick and 5 inches in diameter, and an insulator ring 15 approximately 0.625 inches thick and 4 inches in diameter. These dimensions can be varied somewhat to achieve a particular flashover voltage.

The rise time of the pulse can be further sharpened by adding additional flashover switches in series. Additional insulator-metal gradient ring stages further delay conductance of the pulse. Each stage of flashover switch 14 delays conductance of the pulse by approximately 0.5 nanoseconds.

Figure 2A:
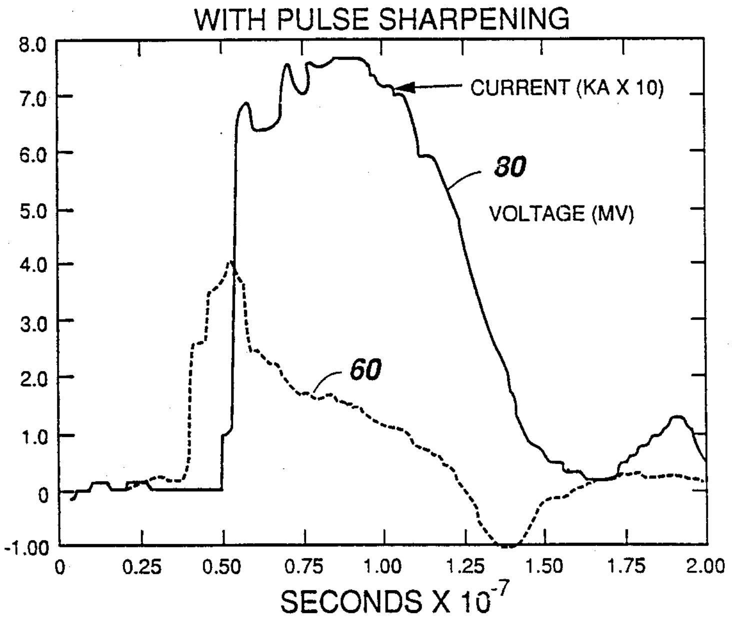
FIG. 2 are plots of voltage and current versus time for high voltage pulses produced both with (Plot A) and without (Plot B) the apparatus of the present invention.
Figure 2B:
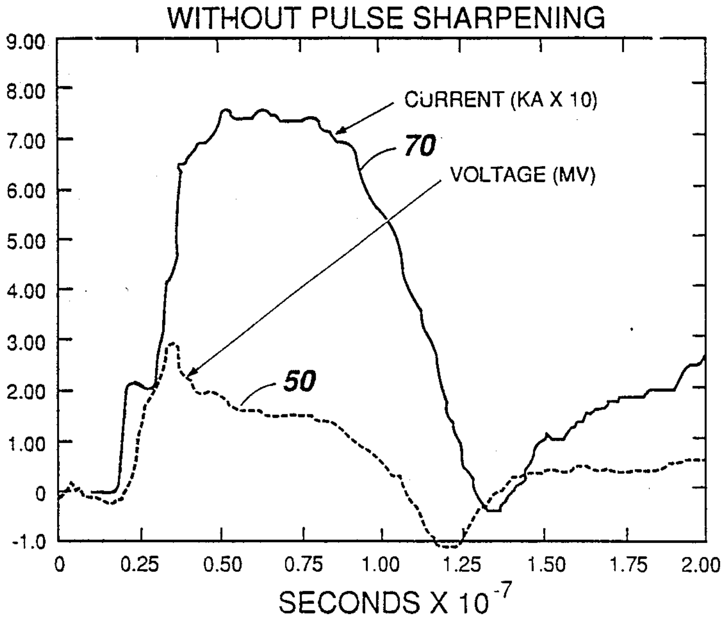

The effects of the pulse sharpening possible with the present invention can be seen by referring to FIG. 2. FIG. 2 contains two plots of current and voltage pulses versus time for high voltage pulses produced by the same accelerator both without and with pulse sharpening. Plot A involves a pulse without the apparatus of the present invention. As seen, the rise time of voltage pulse 50 in plot A is approximately 15 nanoseconds. This compares with voltage pulse 60 in Plot B, where apparatus according to the present invention was employed, for which the rise time downstream of switch 14 is approximately 7 nanoseconds, implied by the collapse of the voltage monitored upstream of flashover switch 14 (FIG. 1). Similar relative improvements are seen between the rise times of current pulse 70 and current pulse 80.

The foregoing description of embodiments of the present invention has been presented for purposes of illustration and description. It is not intended to be exhaustive or to limit the invention to the precise form disclosed, and obviously many modifications and variations are possible in light of the above teachings. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A particle accelerator capable of producing in a vacuum a pulse having a very fast rise time between a cathode and an anode comprising:

means for generating a high-voltage pulse;

a transmission line connected to said generating means for conducting said pulses, said transmission line having inherent capacitance and inductance capable of storing energy magnetically and electrostatically;

a plurality of diode means located radially about said transmission line between said cathode and said anode for diverting energy from said transmission line into said capacitance and inductance of said transmission line;

one or more series connected flashover switch means interposed in said cathode for delaying conductance of said pulse for a determinable period of time before closure of said one or more flashover switch means;

2. The apparatus as described in claim wherein said plurality of diodes are radially positioned about said transmission line approximately 30 centimeters from said one or more flashover means.

3. The apparatus as described in claim 1, wherein said one or more flashover switch means comprises one flashover switch.

4. The apparatus as described in claim 1, wherein said one or more flashover switch means comprises two flashover switches.

5. The apparatus as described in claim 1, wherein said one or more flashover switches comprise a plurality of individual stages, each said stage comprising a metal disk and an insulating disk.

6. The apparatus as described in claim 5, wherein said metal disk comprises stainless steel and said insulating disk comprises nylon, PVC or LEXAN®.

7. The apparatus as described in claim 5, wherein said metal disk comprises aluminum.

8. The method of producing in a vacuum a pulse having a very fast rise time between a cathode and an anode of a particle accelerator comprising the steps of:

generating a high voltage pulse;

conducting said high voltage pulse along a transmission line having inherent capacitance and inductance;

diverting energy from said transmission line into said capacitance and inductance through a plurality of diodes located radially about said transmission line between said cathode and said anode;

storing said energy magnetically and electrostatically in said capacitance and inductance of said transmission line;

delaying conductance of said high voltage pulse for a determinable period of time before closure of one or more flashover switches located between said transmission line and said anode;

transmitting said high voltage pulse and said energy from said capacitance and inductance of said transmission line across said one or more flashover switches to said anode.

* * * * *

UNITED STATES PATENT AND TRADEMARK OFFICE
CERTIFICATE OF CORRECTION

PATENT NO. : 4,897,556

DATED : January 30, 1990

INVENTOR(S) : Ray M. Stringfield et al.

It is certified that error appears in the above-identified patent and that said Letters Patent is hereby corrected as shown below:

On the title page under "United States Patent (19)', delete "Springfield" and replace it with --Stringfield--.

On the title page under "(75) Inventors:" delete "Springfield" and replace it with --Stringfield--.

Signed and Sealed this

Third Day of September, 1991

*Attest:*

HARRY F. MANBECK, JR.

*Attesting Officer*

*Commissioner of Patents and Trademarks*